United States Patent [19]

Kobayashi

[11] Patent Number: 5,273,424
[45] Date of Patent: Dec. 28, 1993

[54] VERTICAL HEAT TREATMENT APPARATUS

[75] Inventor: Jun-ichi Kobayashi, Sagamihara, Japan

[73] Assignee: Tokyo Electron Sagami Limited, Kanagawa, Japan

[21] Appl. No.: 928,096

[22] Filed: Aug. 13, 1992

Related U.S. Application Data

[63] Continuation of Ser. No. 668,167, Mar. 12, 1991, abandoned.

[30] Foreign Application Priority Data

Mar. 23, 1990 [JP] Japan ................................. 2-73666

[51] Int. Cl.⁵ ............................................. F27D 3/12
[52] U.S. Cl. .................................. 432/241; 432/11; 432/24
[58] Field of Search ................ 432/241, 152, 5, 6, 432/11, 24, 48

[56] References Cited

U.S. PATENT DOCUMENTS

| | | | |
|---|---|---|---|
| 4,243,441 | 1/1981 | Wilson | 432/24 |
| 4,678,432 | 7/1987 | Teraoka | 432/24 |
| 4,688,180 | 8/1987 | Motomiya | 432/11 |

FOREIGN PATENT DOCUMENTS

| | | |
|---|---|---|
| 51-15835 | 2/1976 | Japan . |
| 60-46787 | 10/1985 | Japan . |
| 62-142841 | 9/1987 | Japan . |
| 63-138726 | 6/1988 | Japan . |
| 63-142814 | 6/1988 | Japan . |

Primary Examiner—Henry C. Yuen
Attorney, Agent, or Firm—Oblon, Spivak, McClelland, Maier & Neustadt

[57] ABSTRACT

A vertical heat treatment apparatus has a reaction furnace, gas-introducing mechanism, a gas-exhausting mechanism, and temperature-sensing means. The reaction furnace is made up of a reaction tube and a heating mechanism. The reaction tube contains a plurality of objects which are to be treated and which are arranged at predetermined intervals. The heating mechanism is arranged outside of the reaction tube. The gas-introducing means introduces a gas into the reaction tube, and the gas-exhausting mechanism exhausts the gas from the reaction tube. The temperature-sensing mechanism includes a guide pipe which passes through the side wall of the reaction tube and which extends along the inner wall of the reaction tube in the longitudinal direction of the reaction tube. One end of the guide pipe is closed and is located inside the reaction tube, while the other end thereof is open and is located outside of the reaction tube. A bendable temperature-measuring device is inserted in the guide pipe. With this structure, the vertical heat treatment apparatus can perform treatment while simultaneously measuring the temperature in the interior of the reaction tube.

20 Claims, 4 Drawing Sheets

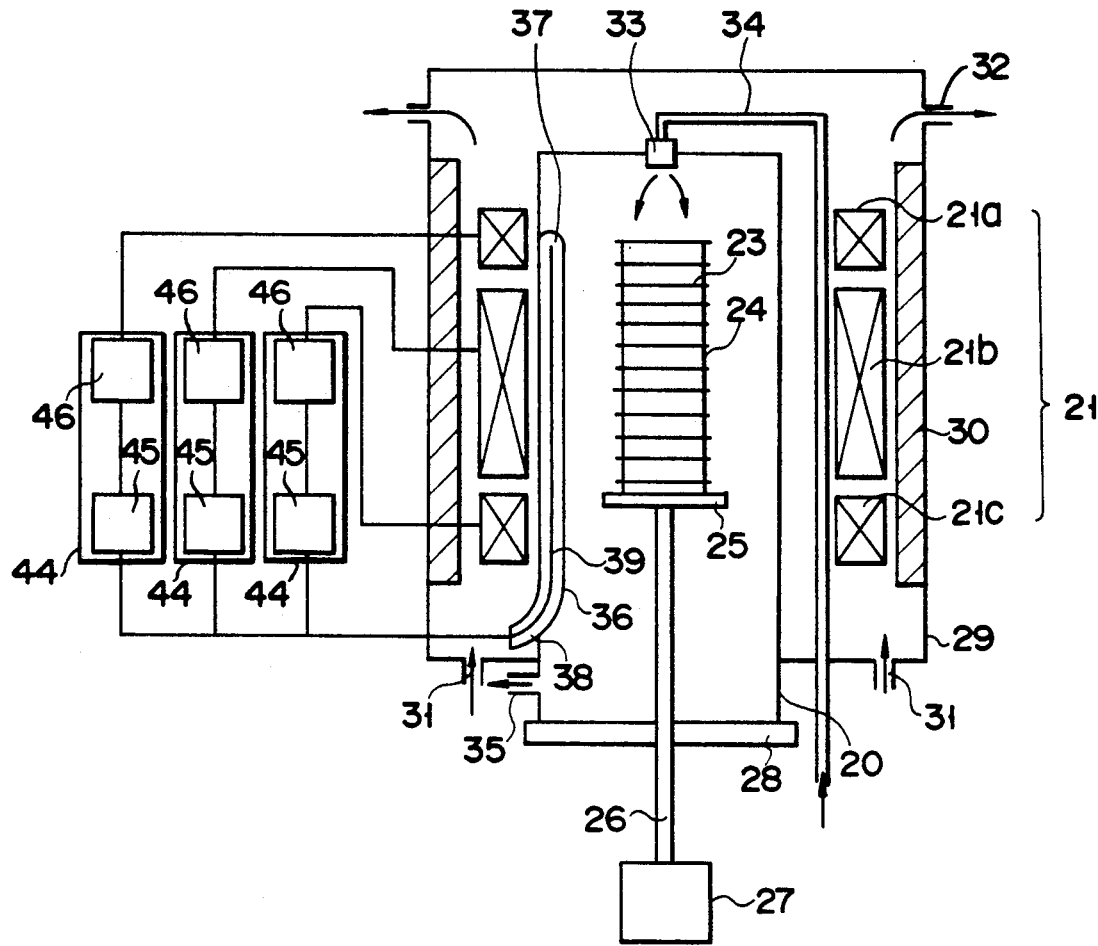
F I G. 2

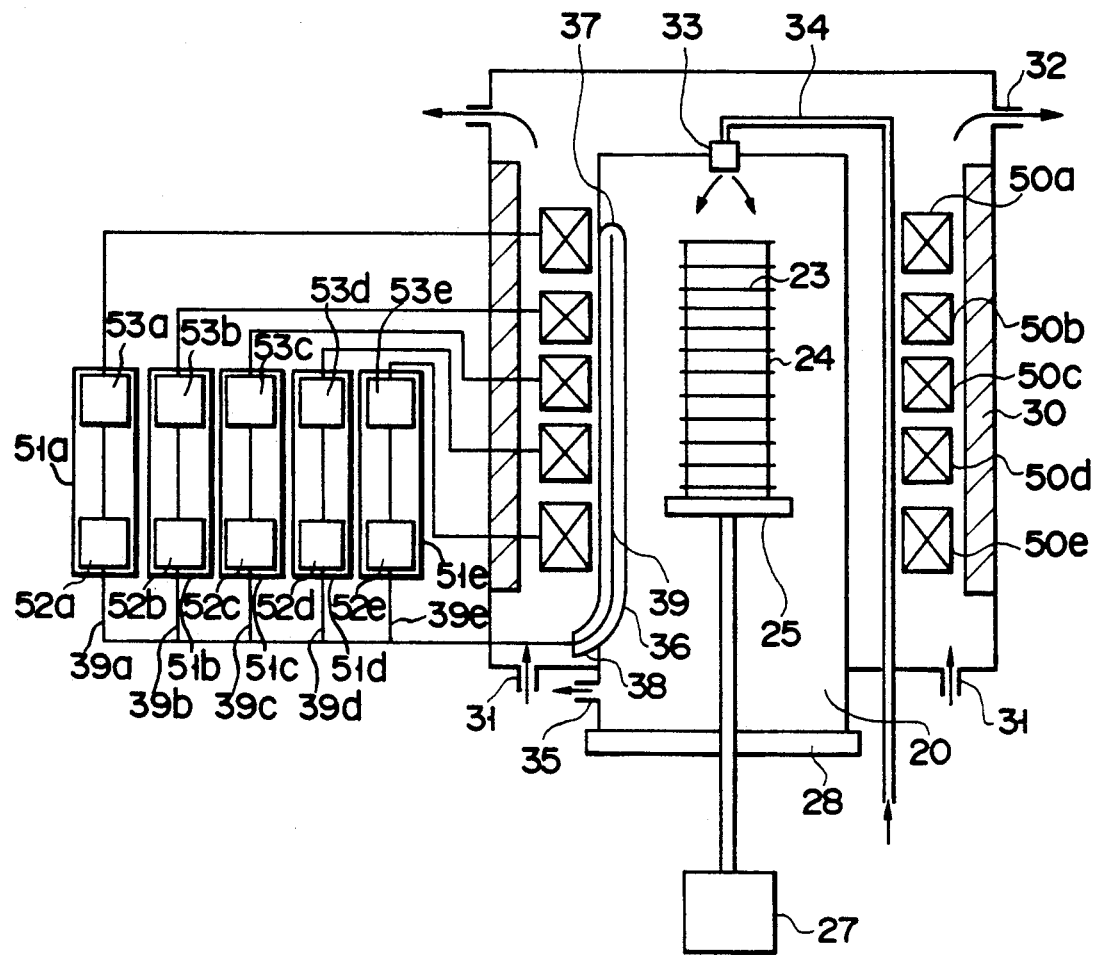
F I G. 5

VERTICAL HEAT TREATMENT APPARATUS

This application is a continuation of application Ser. No. 07/668,167, filed on Mar. 12, 1991, now abandoned.

BACKGROUND OF THE INVENTION

1. Field of the Invention

The present invention relates to a vertical treatment apparatus which is capable of performing heat treatment while simultaneously measuring the temperature in a reaction furnace with high accuracy.

2. Description of the Related Art

In the field of manufacture of semiconductor devices, a vertical heat treatment apparatus is employed as a CVD apparatus (which is used for forming a thin film, such as an oxide film), an epitaxial apparatus, a thermal diffusion apparatus, etc. In the vertical heat treatment apparatus, a plurality of semiconductor wafers, for example 100, are mounted on a wafer boat in a horizontal state such that they are located away from adjacent ones by a predetermined distance. These semiconductor wafers are heat treated in a batchwise operation at high temperature, for example, between 800° C. and 1,000° C.

FIG. 1 shows an example of a conventional heat treatment apparatus. As is shown in FIG. 1, a tubular heating device 11 is arranged around a reaction tube 10, to thereby constitute a reaction furnace. The heating device 11 is made up of an upper heater 11a, an intermediate heater 11b, and a lower heater 11c in order to define the uniformly-heated region extensively, and these heaters heat the interval reaction tube 10 at a desirable temperature between 500° C. and 1,200° C. The reaction furnace is arranged substantially vertical, and is surrounded with a heat insulator 12. A wafer boat 14 is located inside the reaction tube 10 of the reaction furnace, and a large number of semiconductor wafers 13 are arranged in the wafer boat 14 at predetermined intervals in the vertical direction such that each wafer is kept in a horizontal state. The wafer boat 14 is mounted on a turntable 25, which is coupled to a rotating mechanism located outside of the reaction furnace, and can be moved up or down by a conveyance mechanism (not shown), together with the rotating mechanism. The uniform heating is performed by rotating the wafer boat 14 using the rotating mechanism.

A gas supply port 16, through which a reaction gas is supplied into the reaction tube 10, is formed in the top wall of the reaction tube 10. One end of a gas pipe 15 is connected to the ga supply port 16, while the other end thereof is connected to gas supply means (not shown). A gas exhaust port 17, through which a gas is exhausted from the reaction tube 10, is located at a lower portion of the side wall of the reaction tube 10. The gas exhaust port 17 is connected to gas exhaust means (not shown).

The heat insulator 12 has a plurality of through-holes 18, and a thermocouple 19 is inserted in each through-hole 18. The thermocouple 19 can measure the temperature of the outer wall of the reaction tube 10 from outside, with its temperature-measuring end being in contact with the outer wall. That end which is opposite to the temperature-measuring end is connected to control means (not shown).

Published Examined Japanese Patent Application (PEJPA) No. 60-46787 and Published Unexamined Japanese Utility Model Application (PUJUMA) No. 62-142841 each disclose a heat treatment apparatus which enables measurement of the temperature in the interior of the reaction tube 10. In the heat treatment apparatus, a thin quartz pipe is arranged inside the reaction tube, and a rod-shaped thermocouple serving as a temperature sensor is inserted in the quartz pipe.

However, such a thin quartz pipe cannot be fixed inside the reaction tube of a vertical heat treatment apparatus. In the vertical heat treatment apparatus, the upper region of the reaction tube is closed, and the lower region thereof is used for getting a quartz wafer boat (in which a large number of semiconductor wafers are arranged) in and out. If a thin quartz pipe is fixed inside the reaction tube, it may become an obstacle to the installation or removal of the wafer boat. In addition, it narrows the utilizable reaction region in the reaction tube. If the utilizable reaction region in the reaction tube is narrowed, its central axis is shifted from the central axis of the array of the semiconductor wafers arranged in the wafer boat, thus causing disadvantages with respect to the loading of the wafer boat.

Residues of reaction products adhere to the inner wall of the reaction tube during the process of reaction. Thus, the inner wall of the reaction tube is required to be cleaned of such residues by washing the reaction tube several times a month, for example. Usually, the reaction tube is washed by removing it from the heat treatment apparatus and immersing it in a hydrofluoric acid or the like. Since the reaction tube is washed in this way, the thermocouple has to be removable from the reaction tube at the time of washing the reaction tube. If the thermocouple is immovably fixed inside the reaction tube, it is not possible to wash the reaction tube.

Since a thermocouple cannot be immovably fixed inside the reaction tube, as mentioned above, there has been no vertical heat treatment apparatus available which is capable of performing heat treatment while simultaneously measuring the temperature in the interior of the reaction tube.

Conventionally, the temperature in the interior of the reaction tube in which heat treatment is in progress has been determined as follows. First, a temperature sensor incorporating a thermocouple is inserted into the reaction tube before staring heat treatment, and the temperature in the interior of the reaction tube is increased. When the temperature of the sensor has reached a predetermined value, the temperature of the outer wall of the reaction tube is measured, and the relationships between the temperature in the interior of the reaction tube and the temperature of the outer wall of the reaction tube are calculated. On the basis of the temperature relationships, the temperature in the interior of the reaction tube in which heat treatment is in progress is estimated from the temperature of the outer output of the wall of the reaction tube. Subsequently, the output of the heater is controlled in accordance with the estimated temperature, to thereby control the temperature in the interior of the reaction tube.

The temperature control mentioned above is performed on the basis of the estimation of the temperature in the interior of the reaction tube. Therefore, the temperature control is not always performed with precision.

SUMMARY OF THE INVENTION

It is, accordingly, an object of the present invention is to provide a vertical heat treatment apparatus which is capable of performing heat treatment while simultaneously measuring the temperature in the interior of the reaction tube and which enables the temperature in the reaction tube to be controlled with precision.

To achieve this object, the present invention provides a vertical heat treatment apparatus which has a reaction furnace made up of a reaction tube and heating means arranged around the reaction tube, the reaction tube containing a plurality of objects which are to be treated and are arranged at predetermined intervals. gas-introducing means for introducing a gas into the reaction tube, gas-exhausting means for exhausting the gas from the reaction tube, and temperature-sensing means made up of a guide pipe and a bendable temperature-measuring device inserted in the guide pipe, the guide pipe passing through the side wall of the reaction tube and extending along the inner wall of the reaction tube in the longitudinal direction of the reaction tube such that the guide pipe has a closed end located inside the reaction tube and an open end located outside of the reaction tube.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic illustration of a vertical heat treatment apparatus according to a first embodiment of the present invention;

FIG. 5 is a schematic illustration of a vertical heat treatment apparatus according to a second embodiment of the present invention.

DESCRIPTION OF THE PREFERRED EMBODIMENT

Figure 1:
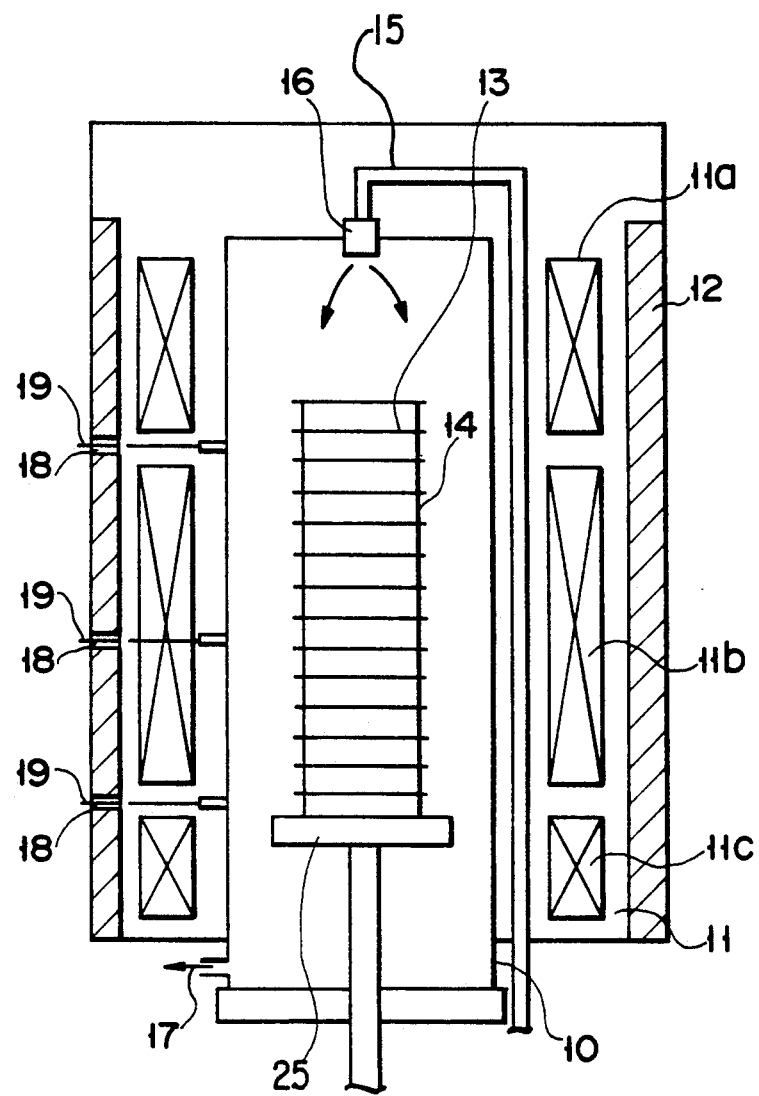
FIG. 1 is a schematic illustration of a conventional vertical heat treatment apparatus.

Embodiments of the present invention will now be described, with reference to the accompanying drawings.

FIG. 2 is a schematic illustration of a vertical heat treatment apparatus according to the first embodiment of the present invention. In the following description of one embodiment, reference will be made of the case where the heat treatment apparatus is used as a diffusion apparatus.

Referring to FIG. 2, reference numeral 20 denotes a reaction tube which is about 1,100 mm tall and made of heat-resistant material such as quartz. A heating device 21 is provided around the reaction tube 20, to thereby constitute a reaction furnace. The heating device 21 is made up of a plurality of heaters disposed in the longitudinal direction of the reaction tube, for example an upper heater 21a, an intermediate heater 21b, and a lower heater 21c. The number of heaters is determined such that all wafers in the reaction tube is accommodated in the uniformly-heated region.

A wafer boat 23, which is about 600 mm tall and made of heat-resistant material such as quartz, is arranged inside the reaction tube 20. The wafer boat 23 contains a plurality of semiconductor wafers 24 (e.g., 100 wafers), and these wafers are arranged at predetermined intervals in the vertical direction such that each wafer 24 is kept in a horizontal state. For example, the wafers 24 are supported by setting them in the groove or ring-shaped support portion which is formed in wafer boat 23, so as to keep the wafers in the horizontal state. The wafer boat 23 is mounted on a turntable 25, which is supported by a drive shaft 26. The drive shaft 26 is connected to a motor 27 and can be rotated thereby. The drive shaft 26 extends through the center of a flange 28, and this flange 28 supports the lower end of the reaction tube 20 and hermetically seals the reaction tube 20. The turntable 25, the driving shaft 26, the motor 27 and the flange 28 can be integrally moved up or down by conveyance means (not shown), so that the wafer boat 23 mounted on the turntable 25 can be arranged in the uniformly-heated region inside the reaction tube 20.

The reaction furnace stands substantially upright inside a chamber 29. A heat insulator 30 is provided on the inner wall of the chamber 29. A cooling gas supply port 31 is formed in the bottom of the chamber 29, and a cooling gas-exhausting port 32 is formed at the upper portion of the side wall of the chamber 29. The cooling gas supply port 31 communicates with cooling gas supply means (not shown), and the cooling gas-exhausting port 32 communicates with suction means (not shown), such as a vacuum pump. With this structure, the interior of the chamber 29 can be cooled by flowing a cooling gas through the chamber 29 after heat treatment.

A gas supply port 33, through which a reaction gas is supplied into the reaction tube 20, is formed in the top wall of the reaction tube 20. One end of a gas pipe 34 is connected to the gas supply port 33, while the other end thereof is connected to reaction gas supply means (not shown). A reaction gas may be supplied from the lower side-wall portion of the reaction tube. A reaction gas-exhausting port 35, through which the reaction gas is exhausted from the reaction tube 20, is formed in that lower side-wall portion of the reaction tube 20 which is located outside of the chamber 29. The reaction gas-exhausting port 35 is connected to suction means (not shown), such as a vacuum pump.

Figure 3:
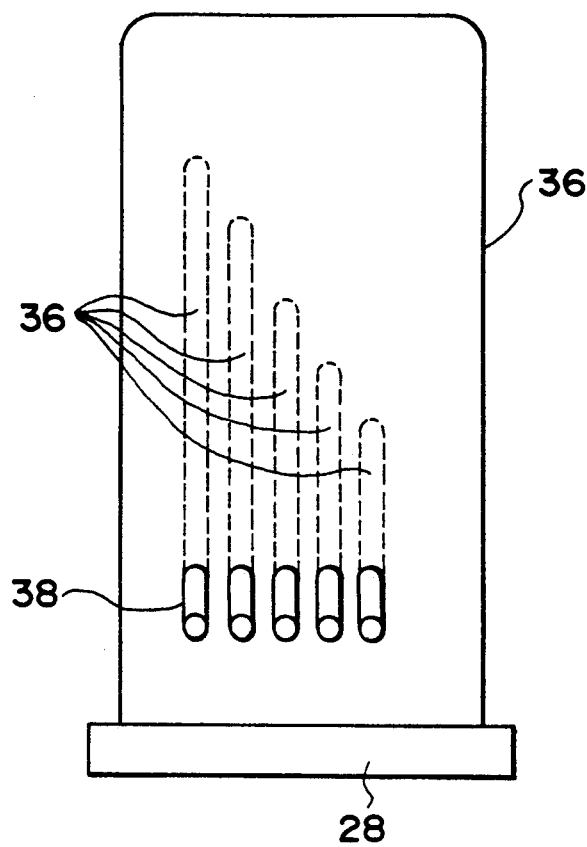
FIG. 3 is a schematic illustration showing how temperature-sensing units are arranged in the vertical heat treatment apparatus of the first embodiment of the present invention.

A plurality of guide pipes 36 extend in the vertical direction and are fixed to the inner wall of the reaction tube 20 by welding. The guide pipe is made of heat resistant material such as quartz. The guide pipe is set on the inner side wall of the reaction tube so as to not be in contact with the wafer boat 23 and the wafers 24, when the wafer boat 23 and the wafer 24 is loaded in the reaction tube. The upper end 37 of each guide pipe 36 is closed, while the lower end thereof 38 is open and is located outside of the reaction tube 20. FIG. 3 shows the arrangement of the guide pipes 36 (the number of which is five in the case of this Figure). As is shown in FIG. 3, the guide pipes 36 have different lengths, so that their upper ends 37 are located at different-level temperature measurement points. In order to prevent the guide pipes 36 from touching the wafer boat 23 or the semiconductor wafers 24, each guide pipe 36 has to be as thin as possible. For example, it is preferable that each guide pipe 36 have a outer diameter of 5 mm$\phi$ and an inner diameter of 3 mm$\phi$. The sectional configuration of the guide pipe may be circular, ellipse, rectangular, and like. A platinum-rhodium thermocouple 39 is inserted into each guide pipe 36 such that its temperature-measuring portion is located at the upper end 37 of the guide pipe 36. The guide pipe 36 and the thermocouple 39 jointly constitute a temperature-sensing unit. The thermocouple used in the present invention need not be a platinum-rhodium type; it may be a chromel-alumel type used in common.

Figure 4:
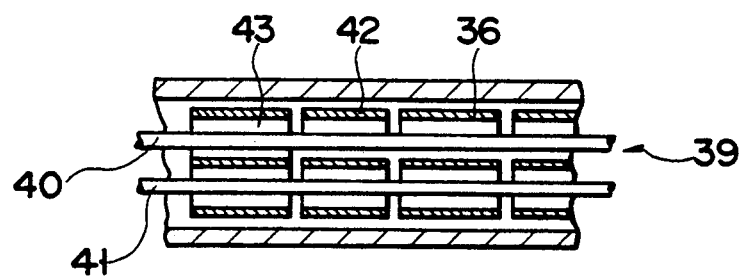
FIG. 4 is a schematic illustration showing part of a temperature-sensing unit employed in the heat treatment apparatus of the first embodiment.

FIG. 4 shows a longitudinal sectional view of a temperature-sensing unit. Referring to this Figure, a platinum-rhodium thermocouple 39 is located inside the guide pipe 36. The thermocouple 39 is made up of: a platinum wire 40 which is 0.5 mm$\phi$ in thickness; a rhodium wire 41 which is also 0.5 mm$\phi$ in thickness; and a large number of electric insulators 42. The insulators 42 are arranged in the longitudinal direction of the guide pipe 36 at predetermined intervals, and support the platinum and rhodium wires 40 and 41. Each insulator 42 is made of a ceramic material, such as alumina, and is in the form of a cylinder having a diameter of 2.5 mm$\phi$ and a length of 5 mm. Two through-holes 43, each having a diameter of 0.7 mm$\phi$, extend in the longitudinal direction of each cylindrical insulator 42 Since the platinum and rhodium wires 40 and 41 are inserted through the through-holes 43 of the insulators 42, they are supported by the insulators 42 while being isolated from each other. Due to the provision of many insulators 42 having the above structure, the thermocouples 39 can be meandered, without causing the platinum and rhodium wires 40 and 4 to touch each other.

At one end, the platinum wire 40 and the rhodium wire 41 are connected to each other and thus together form a U-shaped temperature measuring device, and the connection between the two wires is located at the distal end of the guide pipe 36, i.e., at the temperature-measuring portion. At the other end, the platinum wire 40 and the rhodium wire 41 are connected to a ratio-mixing circuit 44 located in the outside of the chamber 29. As shown in FIG. 2, the ratio-mixing circuit 44 is constituted by a temperature-controlling device 45 and a thyristor 46. Both other ends of the platinum wire 40 and the rhodium wire 41 are connected to the temperature-controlling device 45. The temperature-controlling device 45 is connected to the thyristor 46. The thyristor 46 is connected to the heating device 21 and controls the operation of the heating device 21. The ratio-mixing circuit 44 is provided at least for each heater of the heating device 21. In other words, the number of ratio-mixing circuits 4 is preferably equal to or larger than the number of heaters employed by the heating device 21. As shown in FIG. 5, in the case where five heaters (namely, heaters 50a-50e) are employed in the heating device 21 is five, at least five ratio-mixing circuits 51a-51e are connected to the heaters 50a-50e, respectively. The thrmocouples 39a-39e are connected to the thyristors 52a-52e, respectively, the thyristors 52a-52e, are connected to the temperature-controlling devices 53a-53e, respectively, and the temperature-controlling devices 53a-53e are connected to the heaters 50a-50e. respectively.

The operation of the above diffusion apparatus will now be described. First, the turntable 25, the driving shaft 26, the motor 27 and the flange 28 are integrally raised by the conveyance mechanism (not shown) until the wafer boat 23 containing one hundred wafers 24 comes to the uniformly-heated region inside the reaction tube 20. Since the guide pipe 36 is disposed along the inner side wall of the reaction tube, the guide pipe 36 is not an obstacle in loading or unloading the wafer boat. Since the flange 28 is brought into tight contact with the lower end of the reaction tube 20 when the wafer boat 23 and the wafers 24 are loaded, the reaction tube 20 is hermetically sealed by the flange 28. Next, the interior of the reaction tube 20 is evacuated, and the reaction tube 20 is heated by the heating device 21 until the temperature in the interior of the reaction tube 20 increases to a desirable value. Subsequently, a reaction gas is introduced into the reaction tube 20 from the gas supply port 33. For example, a wafer vapor, or a $N_2$ gas is introduced as the reaction gas. Accordingly, impurity diffusion is performed inside the reaction tube 20. During this treatment, the temperatures at the temperature measurement points are measured by the respective thermocouples 39. The temperature measurements, i.e., signals representing the thermoelectromotive forces measured by the thermocouples, are sent to the ratio-mixing circuits 44. In the ratio-mixing circuits 44, the airthmetic processing based on the thermo-electromotive forces signal is performed in the temperature controlling device 45. Results of this calculation are sent to the thyristor 46, and the power applied to the heaters 21a-21c is controlled in accordance with the results of calculation in the thyristor 46. In this manner, the treatment is carried out, with the temperatures inside the reaction tube 20 being simultaneously subjected to feedback control.

At the end of the treatment, the supply of the reaction gas is stopped. Next, a cooling gas (e.g., air) is introduced into the chamber 29 from the cooling gas supply port 31 formed in the bottom of the chamber 29. Simultaneously, the cooling gas is exhausted from the chamber 29 through the cooling gas-exhausting port 32 formed at the upper portion of the side wall of the chamber 29. In this manner, the interior of the chamber 29 is cooled.

In the above, the present invention was described, referring to the case where the vertical heat treatment apparatus was used as a diffusion apparatus. Needless to say, the same advantages are achieved when the vertical heat treatment apparatus is used as a CVD apparatus, a plasma apparatus, or the like. Moreover, the present invention may be applied to not only a vertical heat treatment apparatus but also a horizontal heat treatment apparatus.

As described above, the vertical heat treatment apparatus of the present invention has a guide pipe which extends along the inner wall of the reaction tube in the longitudinal direction of the reaction tube and which has a closed end located inside the reaction tube and an open end located outside the reaction tube, and a temperature sensing means having a bendable temperature-measuring device inserted in the guide pipe. Due to this structure, the vertical heat treatment apparatus is capable of performing treatment while simultaneously measuring the temperature in the interior of the reaction tube with high accuracy.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A vertical heat treatment apparatus, comprising:
   a reaction furnace including a reaction tube, which is closed at an upper end and open at a lower end thereof, for housing a plurality of objects to be treated, which are arranged at predetermined intervals, and a heating device having a heater arranged outside said reaction tube and a casing surrounding an entire region of the reaction tube except the open lower end;
   a gas introducing pipe connected to a gas supply port mounted at the top portion of the reaction tube and extending downward such that the lower end of said pipe is positioned downward of the heating device;
   a gas exhaust port mounted to a side wall of the reaction tube at a lower end portion of said reaction tube; and
   a temperature sensor for measuring the temperature within the reaction tube while said objects are being treated within the vertical heat treatment apparatus, said temperature sensor including a guide pipe and a U-shaped bent temperature measuring device inserted in the guide pipe, said guide pipe being made of quartz as well as being closed at one end and open at the other end, said one end portion of the guide pipe extending along the inner surface of the reaction tube, said other end portion of the guide pipe extending through the side wall of the reaction tube so as to be positioned outside the reaction tube, and said guide pipe being fixed to the inner surface of the reaction tube.

2. The apparatus according to claim 1, wherein said bendable temperature measuring device comprises thermocouple.

3. The apparatus according to claim 2, wherein said thermocouple comprising the bendable temperature measuring device includes two metal wires each supported by a plurality of insulators such that said metal wires are prevented from mutual contact.

4. The apparatus according to claim 1, wherein said temperature measuring device is connected to a temperature control.

5. The apparatus according to claim 1, which further comprises a transfer device including a table on which a plurality of objects are disposable a predetermined distance apart from each other, a flange mounted at a lower portion of said table, and a driving source for vertically moving said flange, wherein said table is disposed within the reaction tube and said flange serves to close the open end of the reaction tube.

6. The apparatus according to claim 5, wherein a driving shaft is mounted to said table, said shaft extending through the flange and being joined to the driving source.

7. A vertical heat treatment apparatus, comprising:
   a reaction furnace including a reaction tube, which is closed at an upper end and open at a lower end thereof, for housing a plurality of objects to be treated, which are arranged at predetermined intervals, and a heating device having a heater arranged outside said reaction tube and a casing surrounding an entire region of the reaction tube except the open lower end;
   a gas introducing pipe connected to a gas supply port mounted at the top portion of the reaction tube and extending downward such that the lower end of said pipe is positioned downward of the heating device;
   a gas exhaust port mounted to a side wall of the reaction tube at a lower end portion of said reaction tube; and
   a temperature sensor for measuring the temperature within the reaction tube while said objects are being treated within the vertical heat treatment apparatus, said temperature sensor including a plurality of guide pipes and a U-shaped bent temperature measuring device inserted in each of the guide pipes, each of said guide pipes being made of quartz and being closed at one end and open at the other end, said one end portion of the guide pipe extending along the inner surface of the reaction tube, said other end portion of the guide pipe extending through the side wall of the reaction tube to be positioned outside the reaction tube, and said guide pipes being substantially equal to each other in height at the other end and being different in length.

8. The apparatus according to claim 7, wherein said temperature sensor comprises five guide pipes.

9. The apparatus according to claim 7, wherein said bendable temperature measuring device comprises a thermocouple.

10. The apparatus according to claim 7, wherein said thermocouple comprising the bendable temperature measuring device includes two metal wires each supported by a plurality of insulators such that said metal wires are prevented from mutual contact.

11. The apparatus according to claim 7, wherein said temperature measuring device is connected to a temperature control.

12. The apparatus according to claim 7, which further comprises a transfer device including a table on which a plurality of objects are disposable a predetermined distance apart from each other, a flange mounted at a lower portion of said table, and a driving source for vertically moving said flange, wherein said table is disposed within the reaction tube and said flange serves to close the open end of the reaction tube.

13. The apparatus according to claim 12, wherein a driving shaft is mounted to said table, said shaft extending through the flange to be joined to the driving source.

14. A vertical heat treatment apparatus, comprising:
   a reaction furnace including a reaction tube, which is closed at an upper end and open at a lower end thereof, for housing a plurality of objects to be treated, which are arranged at predetermined intervals, and a heating device having a plurality of heaters arranged outside said reaction tube and a casing surrounding an entire region of the reaction tube except the open lower end thereof;
   a gas introducing pipe connected to a gas supply port mounted at the top portion of the reaction tube and extending downward such that the lower end of said pipe is positioned downward of the heating device;
   a gas exhaust port mounted to a side wall of the reaction tube at a lower end portion of said reaction tube; and
   a temperature sensor for measuring the temperature within the reaction tube while said objects are being treated within the vertical heat treatment apparatus, said temperature sensor including a plurality of guide pipes and a U-shaped bent temperature measuring device inserted in each of the guide pipes, each of said guide pipes being made of quartz and being closed at one end and open at the other end, said one end portion of the guide pipe extending along the inner surface of the reaction tube, said other end portion of the guide pipe extending through the side wall of the reaction tube so as to be positioned outside the reaction tube, said guide pipe being substantially equal to each other in height at the other end and being different in length, and said one end portion of each of said guide pipes extending to reach a heating region heated by said heater.

15. The apparatus according to claim 14, wherein said heating device comprises five heaters and five guide pipes corresponding to said five heaters.

16. The apparatus according to claim 14, wherein said bendable temperature measuring device comprises a thermocouple.

17. The apparatus according to claim 14, wherein said thermocouple constituting the bendable temperature measuring device comprises two metal wires each supported by a plurality of insulators such that said metal wires are prevented from mutual contact.

18. The apparatus according to claim 14, wherein said temperature measuring device is connected to a temperature control.

19. The apparatus according to claim 14, which further comprises a transfer device which includes a table on which a plurality of objects are disposable a predetermined distance apart from each other, a flange mounted at a lower portion of said table, and a driving source for vertically moving said flange, wherein said table si disposed within the reaction tube and said flange serves to close the open end of the reaction tube.

20. The apparatus according to claim 19, wherein a driving shaft is mounted to said table, said shaft extending through the flange and being joined to the driving source.

* * * * *